US006883129B2

United States Patent
Biewenga et al.

(10) Patent No.: US 6,883,129 B2
(45) Date of Patent: Apr. 19, 2005

(54) ELECTRONIC CIRCUIT AND METHOD FOR TESTING

(75) Inventors: Alexander Sebastian Biewenga, Eindhoven (NL); Leon Albertus Van De Logt, Eindhoven (NL); Franciscus Gerardus Maria De Jong, Eindhoven (NL); Guillaume Elisabeth Andreas Lousberg, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 424 days.

(21) Appl. No.: 10/217,811

(22) Filed: Aug. 12, 2002

(65) Prior Publication Data

US 2003/0051198 A1 Mar. 13, 2003

(30) Foreign Application Priority Data

Aug. 16, 2001 (EP) .......................................... 01203126

(51) Int. Cl.[7] .............................................. G06F 11/00
(52) U.S. Cl. ...................................... 714/738; 714/733
(58) Field of Search ............................... 714/726, 733, 714/734, 724, 738; 716/4; 703/14

(56) References Cited

U.S. PATENT DOCUMENTS 4,658,225 A     4/1987   Dukes et al. ............... 333/166
4,703,484 A  * 10/1987   Rolfe et al. ................. 714/726
5,155,733 A  * 10/1992   Blecha, Jr. .................. 714/733
5,392,297 A  *  2/1995   Bell et al. ................... 714/734
5,481,471 A  *  1/1996   Naglestad et al. ............ 716/4
6,087,968 A     7/2000   Roza ............................ 341/143
6,378,090 B1 *  4/2002   Bhattacharya ............... 714/724
6,456,961 B1 *  9/2002   Patil et al. ................... 703/14
6,499,125 B1 * 12/2002   Ohta et al. ................... 714/734

FOREIGN PATENT DOCUMENTS

| DE | 10005161 A | 11/2000 | .......... G11C/29/00 |
| EP | 0628831 B1 | 12/1994 | .......... G01R/31/318 |
| WO | WO9939218 | 8/1999 | .......... G01R/31/28 |

* cited by examiner

Primary Examiner—David Ton
(74) Attorney, Agent, or Firm—Michael Jure

(57) ABSTRACT

An integrated circuit is switchable between a normal operating mode and a test mode. A functional circuit and a test pattern converter are both coupled between input contacts, output contacts and a redefinable contact of the integrated circuit. In the test mode respectively the test pattern converter drives the outputs contacts and, dependent on the circuit configuration, the redefinable contact. The test pattern converter is arranged to provide a first and second relation between signals at the input contacts and the output contacts, with the redefinable contact used as an input or output contact respectively, dependent on the circuit configuration. The relations have been selected so as to permit testing of stuck-at and cross-connect errors with the redefinable contact used as input and output contact respectively.

11 Claims, 3 Drawing Sheets

ELECTRONIC CIRCUIT AND METHOD FOR TESTING

Figure 1:
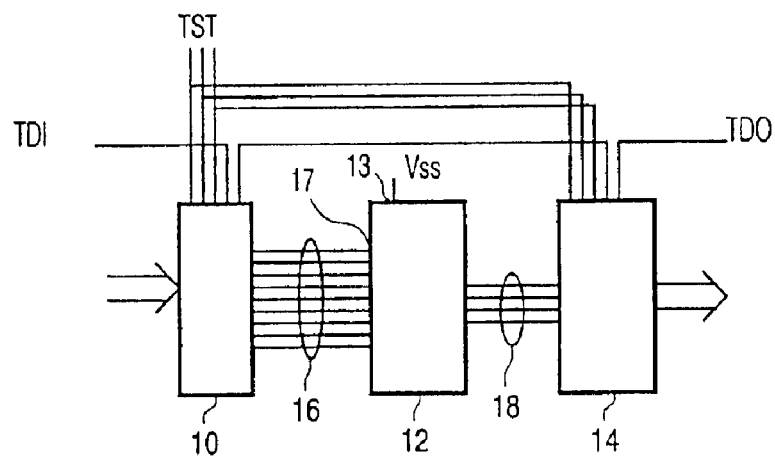

The invention relates to an electronic circuit and a method of testing such an electronic circuit.

Conventionally, testing of electronic circuits is performed using boundary scan circuitry. However, boundary scan circuitry requires the use of integrated circuits with dedicated test pins, which is not always desirable.

PCT patent application No. WO 99/39218 describes an integrated circuit that provides for circuit testing without using dedicated test contacts, or at least using fewer test contacts than needed for boundary scan testing (herein, "contacts" will be used as a generic term for any terminal with which the integrated circuit can be connected to outside circuits, including for example pins, bond pads etc.).

This known integrated circuit can be switched into a test mode, in which it switches on a circuit that realizes a special relation between signals at its input and output contacts. This special relation is designed to make a complete set of faults in the connections to and from the integrated circuit observable at the output contacts by feeding a series of input signals to the integrated circuit via these connections.

Preferably, the set of observable faults includes "stuck at" faults or "and" faults. To test for such faults, the special relation must be such that for some possible input signal values there will be an observable deviation from the expected fault-free signal at an output if the signal at any input contact or connection from an output contact is stuck at a logic level, or if its logic level does not change independently from that of the signals on other input contacts or connections from the output contacts. To make this set observable, WO 99/39218 discloses the use of special relations which meet the requirements that (1) the input signal of each contact should affect the output signals on at least one of the output contacts
(2) the output signal on each output contact must vary as the "exclusive or" of the signals on two or more of the input contacts
(3) the output signals on no two of the output contacts should depend only on input signals from the same input contacts.

This input/output relation may be realized by means of a set of interconnected exclusive or gates, or using a simple memory that is addressed by signals from the input contacts and whose data outputs are coupled to the output contacts of the integrated circuit in the test mode. This makes it possible to test the connections to the integrated circuit after the integrated circuit has been mounted in an electronic circuit, by using drivers from other circuits in the electronic circuit to feed signals to the input contacts and reading the resulting response from the output contacts with the other circuits.

However, this technique does not envisage the possibility that the some of the contacts of the integrated circuit can function either as input or as output, depending on the electronic circuit in which the integrated circuit is incorporated. This is the case for example with memories in which the data word size is adjustable in exchange for address width. When a larger word size is used some of the bits of each word are output on contacts that serve as address contacts when a larger number words of smaller size is used. In this case, some of the electronic circuits in which the integrated circuit may be incorporated drive the contacts in question and other ones of these electronic circuits merely read signals from those contacts. Yet another electronic circuit may not be able to drive the contact at a time when the electronic circuit reads other outputs of the integrated circuit (when the redefinable contact is used as one of the data input/outputs of a memory for example).

In circuits where the redefinable contact is used as output it should be used as such by the test pattern converter to ensure a complete test, but in circuits that do not use the redefinable contact as output the signals at the redefinable contact cannot be observed. Thus, the set of observations is incomplete and therefore some faults in the connections may remain unobservable in some electronic circuits.

Amongst others, an object of the invention is to provide for a single integrated circuit that facilitates testing of connections to the integrated circuit both when it is used in electronic circuits in which a redefinable contact of the integrated circuit serves as input as well as when the integrated circuit is used in electronic circuits in which the redefinable contact serves as output contact during the test.

The invention provides for an integrated circuit according to Claim 1. This integrated circuit provides for a first and second input output relation in the test mode, one relation being selected dependent on the circuit configuration. The first input output relation uses the redefinable contact as input contact and the second relation uses the redefinable contact as output contact. The relations have been selected so as to permit testing of stuck-at and cross-connect errors with the redefinable contact used as input and output contact respectively.

That is, each of the relations is such that, for some possible signal values that can be fed to the inputs of the relation via the connections, there will be an observable deviation from the expected fault-free signal at a connection from an output if the signal at any input contact or connection from an output contact is stuck at a logic level, or if the logic level of this signal does not change independently from that of the signals on other input or output contacts.

It will be understood that the claim covers also the situation where the redefinable contact is one of a plurality of redefinable contacts, the input/output relations providing testability with this plurality used as input or output respectively.

In an embodiment of the integrated circuit according to the invention the test pattern converter is realized with a set of exclusive or gates, which serves to realize both input/output relations, switching between the relations being implemented by means of a controllable coupling, such as a tri-state driver, that is enabled dependent on the circuit configuration. Thus, testability is realized with a small amount of circuitry.

Preferably, the test pattern converter meets the conditions that
1) each input signal, both from redefinable inputs and not-redefinable inputs, should affect at least one not-redefinable output signals
2) each output should have a signal at least dependent on whether there is a difference between two of the signals from not-redefinable inputs
3) no two outputs should have a signal dependent in the same way on signals from the not-redefinable inputs
4) no redefinable output signal should depend on the redefinable input signal to which it may be redefined.

In another embodiment, the test pattern converter is realized by means of two sub converters, of which one is selected to deliver the output signals, dependent on the circuit configuration.

These and other objects and advantageous aspects of the circuits and method according to the invention will be described in more detail using the following Figures.

Figure 2:
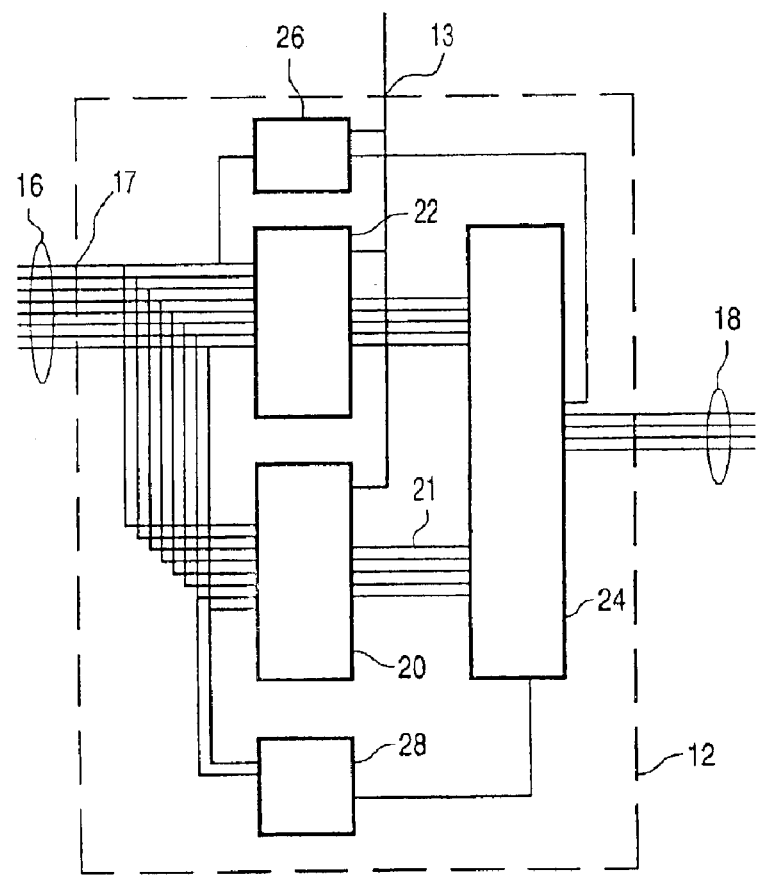
Figure 3:
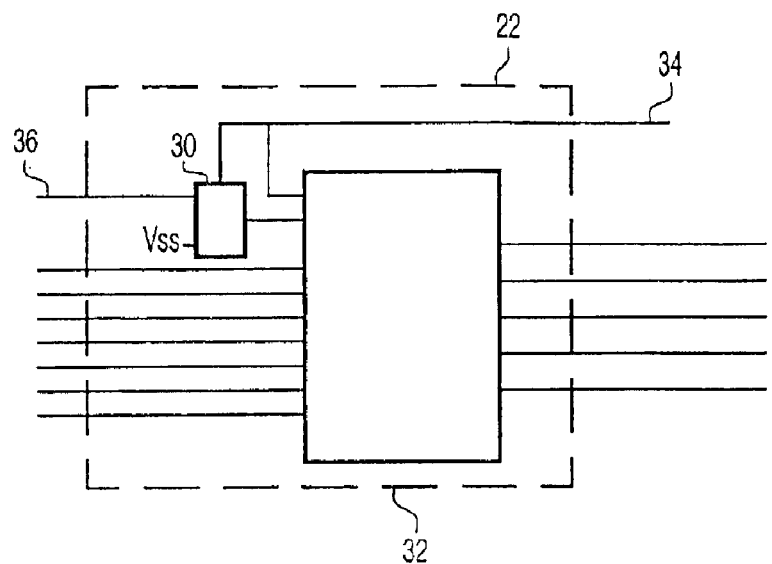
Figure 4:
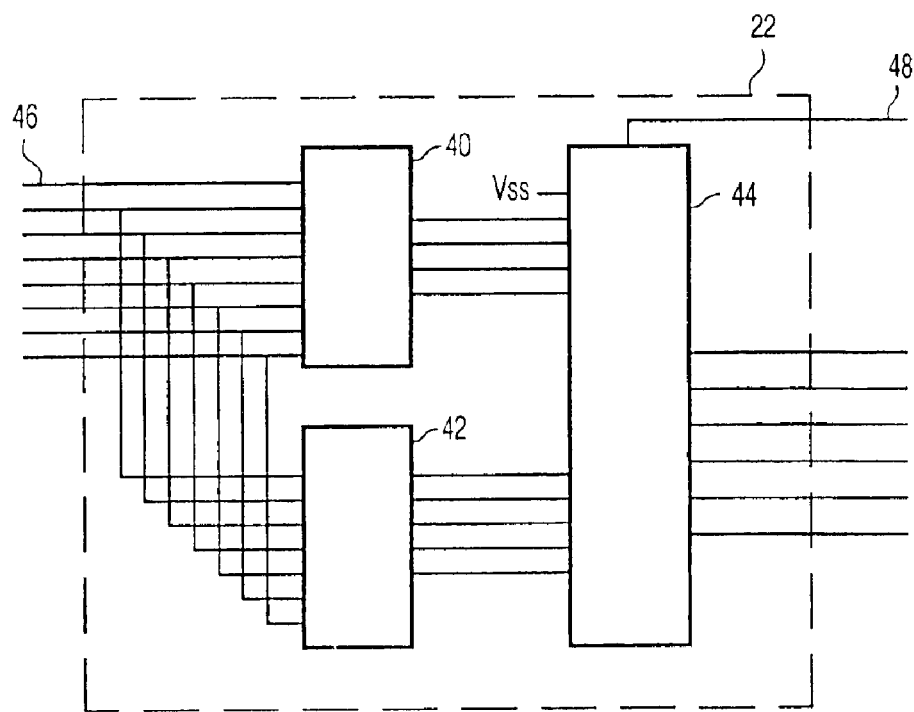
Figure 5:
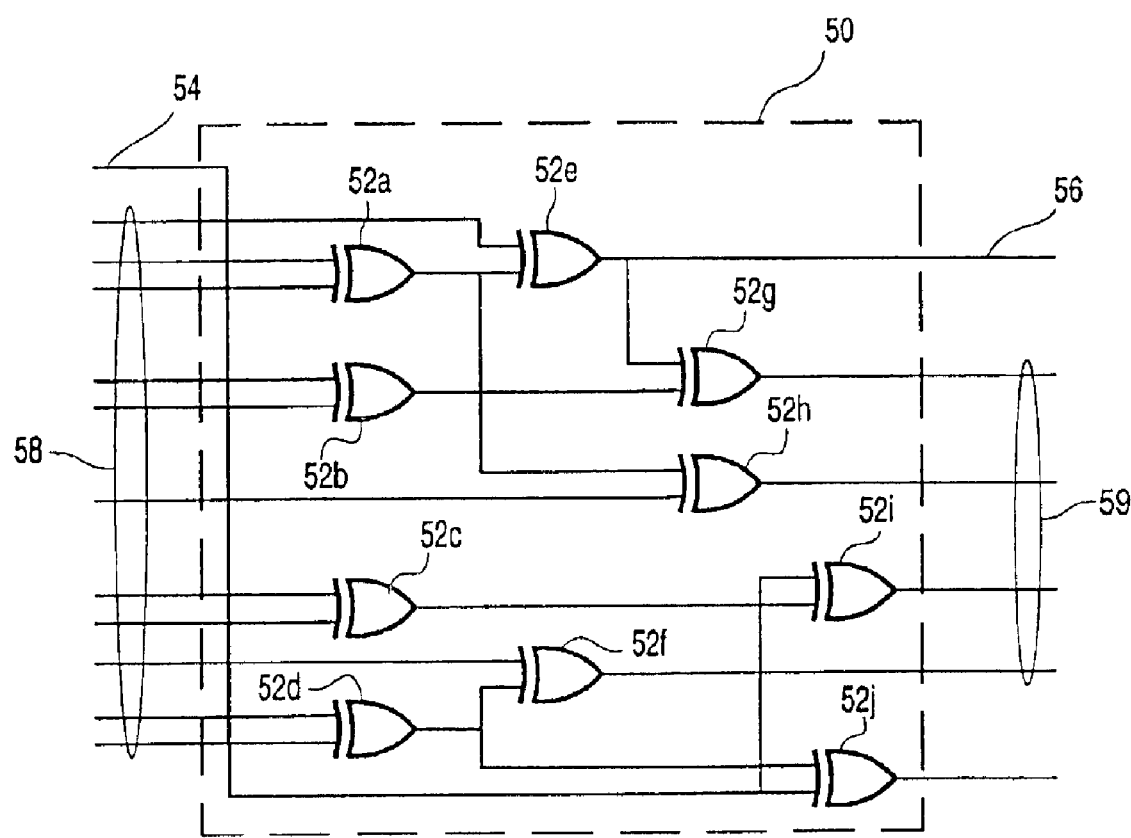

FIG. 1 shows part of an electronic circuit;
FIG. 2 shows an integrated circuit;
FIG. 3 shows a test pattern converter;
FIG. 4 shows another test pattern converter;
FIG. 5 shows yet another test pattern converter.

FIG. 1 shows part of an electronic circuit that comprises a first, second and third integrated circuit 10, 12, 14. The electronic circuit is has a test interface TST/TDI/TDO connected to the first and third integrated circuit 10, 14. The second integrated circuit 12 has binary logic inputs 16 and binary logic outputs 18 coupled to the first and third integrated circuit 10, 14 respectively. The contact 17 of the second integrated circuit 12 for one of the inputs 16 is indicated separately. The second integrated circuit 12 has a configuration selection input 13 coupled to a supply voltage Vss. In an example the second integrated circuit 12 may be a flash memory, with address inputs 16 and data input/outputs 18. It will be understood that FIG. 1 shows only a simplified part of the electronic circuit: in practice, there may be more diverse connections between the integrated circuits 10, 12, 14 and many more integrated circuits may be present in the electronic circuit, including for example intermediate drivers between the second integrated circuit 12 and the first or third integrated circuit 10, 14. Preferably the electronic circuit comprises a printed circuit board on which the integrated circuits 10, 12, 14 are mounted.

In operation the first integrated circuit 10 supplies signals, such as address signals, to the second integrated circuit 12 and the second integrated circuit 12 supplies signals, such as data signals, to the third integrated circuit 14. The contact 17 of the second integrated circuit 12 has a definable function. In the electronic circuit of FIG. 1 it serves as to connect an input, but in other circuits (not shown) it serves to connect an output. Selection between input and output service is made by means of the voltage at the configuration selection input 13. (The external input 13 is but one example of the means by which the configuration can be selected. For example, one may also use on input that is bonded to Vss or another power supply Vdd internally, or connected on chip via a blowable fuse or a conductor that is included only in versions of the integrated circuit for a specific configuration).

In the example of a flash memory, the memory may for example be configurable as a memory of N addresses with 16 bit words, and a memory of 2N addresses of 8 bit words. The contact 17 serves as a data bit output in the 16 bit word configuration, and serves as an address bit input in the 8 bit word configuration. It will be appreciated that the showing of one redefinable contact 17 is merely an example. In practice, many more of such redefinable contacts may be present. For example, when a memory has configurations for N addresses of 8 bits and 8N addresses of 1 bit, three of the data bit outputs of the 8 bit word configuration will be used as address inputs of the 1 bit word configuration.

The electronic circuit is operable in a normal mode and a test mode. In the test mode test signals are written to and read from the first and third integrated circuit 10, 14. The second integrated circuit 12, however, has no contacts for a test interface. To allow testing of the connections 16, 18 to and from the second integrated circuit special measures have been taken.

FIG. 2 shows an embodiment of integrated circuit 12. The integrated circuit 12 contains a functional circuit 20, a test pattern converter 22, a multiplexer 24, a tri-state driver 26 and a mode switching circuit 28. The inputs 16 are coupled to the functional circuit 20 and the test pattern converter 22. The functional circuit 20 and the test pattern converter 22 are coupled to the outputs 18 via multiplexer 24. Mode switching circuit 28 receives some of the inputs 16 and has an output coupled to a control input of multiplexer 24. Tri-state driver 26 is coupled between one of the outputs of multiplexer 24 and the redefinable contact 17. Configuration selection input 13 is coupled to a control input of tri-state driver 26 and to the functional circuit 20. The tri-state driver 26 serves to control whether or not there is a driving coupling to the redefinable contact 17. A similar result may be realized with many other circuits, such as for example a switch which is opened or closed dependent on the configuration.

In operation in the normal operating mode, mode switching circuit 28 outputs a control signal to multiplexer 24 to pass output signals from functional circuit 20 to outputs 18 and tri-state driver 26. Functional circuit 20 uses input signals from inputs 16 as input. A signal from configuration selection input 13 determines whether functional circuit 20 uses the signal from contact 17 as input and whether one of an output 21 of functional unit 20 is used as output. The signal from output 21 is passed to tri-state driver 26 by multiplexer 24. In the configuration shown in FIG. 1, tri-state driver 26 does not pass this signal to contact 17. However, if a different signal is applied to configuration selection input 13, tri-state driver 26 supplies the output signal from functional circuit 20 to contact 17.

The circuit 12 is brought into test mode for example on power up, or by a applying normally forbidden signal sequence on inputs 16. It is not relevant to the invention which conditions are used to switch into test mode. Mode switching circuit 28 detects these conditions and in response, it outputs signals indicative of the test mode. In this mode multiplexer 24 passes output signals from test pattern converter 22 to outputs 18 and to the tri-state driver 26. As in the normal operating mode, the signal at configuration selection input 13 determines whether tri-state driver 26 supplies the output signal from test circuit 20 to contact 17.

Test pattern converter 22 is designed to make it possible to test the connections to and from integrated circuit 12 for "stuck at" faults and cross-connect faults. A "stuck at" fault is a fault that causes an input or output to remain at a fixed logic level, for example because of a short circuit between a power supply connection and the input or output. A cross-connect fault is a fault that makes it impossible for the signals on two inputs, two outputs or an input and an output to assume a certain combination of values. This occurs for example when these two inputs, two outputs or input and output are in conductive contact.

During the test one applies a series of test signals from first integrated circuit 10 to second integrated circuit 12 and reads the output signals from second integrated circuit 12 into the second integrated circuit. Preferably, the test signals are transported into the first integrated circuit 10 and the resulting output signals are read from third integrated circuit 14 via test interface TST/TDI/TDO.

Errors are detected through the detection of deviations between the observed resulting output signals and the output signals that should occur on the basis of the input/output relation of test pattern converter 22. The input output relation of test pattern converter 22 is selected to make it possible to detect all possible stuck at and cross-connect faults in the connections between the second integrated circuit 12 and the first and third integrated circuit 10, 14.

In the absence of the possibility to redefine the input/output function of redefinable contact 17 this is realized when the input output relation meets three conditions:

1) each input signal should affect at least one output signal.
2) each output signal should at least depend on whether there is a difference between two of the input signals
3) no two output signals should depend in the same way on the input signals.

Many circuits satisfy these requirements. A simple way of designing such a circuit is to assign a group of inputs to each outputs, so that each group contains two inputs, the groups for no two outputs are identical and each input belongs to at least one group. Then the requirements are realized by a circuit with a respective subcircuit for each group that computes the exclusive or of the inputs from the group and feeds the result to the output associated with the group.

In order to support a redefinable contact, additional measures are needed. FIG. 3 shows a first embodiment of test pattern converter 22 to support a redefinable contact. The converter 22 contains a multiplexer 30 and a read only memory 32. The inputs of the converter 22 are coupled to address inputs of the memory 32. An input 36 from the redefinable contact 17 (not shown) is coupled to an address input via a first input of multiplexer 30. A second input of multiplexer 30 is coupled to a default logic level Vss. A configuration selection input 34 is coupled to a control input of the converter 22 and to an address input of memory 32.

In operation memory 32 stores two input/output relations, one for each possible configuration of the redefinable contact 17. A first one of the input/output relation meets the conditions for realizing testability, with N=8 inputs and M=4 outputs, the second one of the relations meets the conditions for testability with N−1=7 inputs and M+1=5 outputs. A configuration selection signal from configuration selection input 34 selects which of the input/output relations is used to determine the output signals of memory. In the configuration where the redefinable contact serves as input, the signal from the redefinable contact is fed to the address input of the memory 32 by multiplexer 30. In the configuration where the redefinable contact serves as output, a default signal Vss replaces the signal from the redefinable contact as address signal.

It will be appreciated that instead of the read only memory 32 other circuits for realizing the required input/output relation may be used, such as dedicated logic or a set of interconnected exclusive OR gates. The multiplexer 30 may be omitted (only the signal from input 34 being supplied to memory 32) if the output of memory 32 does not depend on the input 34 when the configuration for testing N−1 inputs is selected.

FIG. 4 shows another embodiment of converter 22 for realizing testability of redefinable contacts. The converter 22 contains a first and second sub-converter 40, 42 and a multiplexer. The inputs of the integrated circuit are coupled to both sub-converters, the input 46 from the redefinable contact 17 (not shown) being coupled only to the first sub-converter 40. The input/output relations of both sub-converters 40, 42 are designed to meet the requirements to allow testing for faults in the connections to the integrated circuit, each in a respective one of the configurations of the redefinable contact 17. The first sub-converter 40 is designed for N(=8) inputs and M(=4) outputs and the second sub-converter 42 is designed for N−1 inputs and M+1 outputs. The outputs of both sub-converters 40, 42 are coupled to the inputs of multiplexer 44. The first sub-converter 40 has one output less than the second sub-converter 42. A default signal Vss is supplied to multiplexer 44 instead of this output. The output of the multiplexer 44 forms the output of the converter 22.

In operation, a configuration selection signal from a configuration selection input 48 controls multiplexer 44 so as to pass the output of the first subconverter 40 (supplemented with the default signal) or the second subconverter 42 to the output of the converter 22, dependent on the configuration.

FIG. 5 shows yet another embodiment of the converter 50 (in this embodiment with a larger number of inputs) with input 54 and output 56 for a redefinable contact 17 (not shown). In this embodiment a set of exclusive OR gates 52a–i realizes the required input/output relation for both configurations. Thus, this circuit is a multi-purpose converter. In order to meet the requirements for both configurations such a multi-purpose converter is designed to have an input output relation that meets modified requirements 1) each input signal, both from redefinable inputs 54 and not-redefinable inputs 58, should affect at least one not-redefinable output 59 signal
2) each output 56, 59 should have a signal at least dependent on whether there is a difference between two of the signals from not-redefinable inputs 58
3) no two outputs 56, 59 should have a signal dependent in the same way on signals from the not-redefinable inputs 58
4) no redefinable output 56 signal should depend on the redefinable input 54 signal to which it may be redefined.

The latter conditions prevents that the circuit exhibits memory effects. In operation such a circuit realizes the required input/output relation which allows testing for faults in the connections to the integrated circuit in both configurations. Only a tri-state driver 26 is needed to switch configuration. Testing is also possible if condition 4) is not met, but such testing involves establishing the memory state of the test pattern converter as part of testing and is therefore more complicated.

Many circuits meet these requirements. One simple way to design such circuits is to associate respective groups of inputs with the outputs and to supply the exclusive or of the inputs from each group to the output associated with the group. Each group should contain at least two not-redefinable inputs, no two groups should be identical except for its redefinable inputs, each input should belong to at least one group, and no redefinable inputs should not belong to the group of the redefinable output to which it can be redefined.

FIG. 5 shows a circuit that meets the requirements. The output of an exclusive OR circuit (or equivalently an exclusive NOR) depends on the logic difference between its input signals. It can readily be seen that each output 56, 59 depends on the output of an exclusive OR of not-redefinable inputs 58, that each input 54, 56 affects at least one not redefinable output 59 and that no two outputs have the same dependence on the inputs. It will be appreciated that the circuit shown in FIG. 5 is only one example of a circuit that can be used to satisfy the requirements.

It will further be appreciated that the number of inputs and outputs, both of the redefinable kind and the non-redefinable kind shown in the Figures has been selected by way of example only. Without deviating from the invention other numbers can be selected.

What is claimed is:

1. An integrated circuit that is switchable between a normal operating mode and a test mode, the integrated circuit having input contacts, output contacts and a redefinable contact that has an input or output function selected dependent on a circuit configuration, the circuit comprising a functional circuit and a test pattern converter, both coupled between the input contacts, the output contacts and the redefinable contact; the functional circuit and the test pattern converter, in the normal operating mode and the test mode respectively, driving the outputs contacts and, dependent on the circuit configuration, the redefinable contact, the test pattern converter being arranged to provide a first and second relation between signals at the input contacts and the output contacts, with the redefinable contact used as an input or output contact respectively, dependent on the circuit configuration, the relations having been selected so as to permit testing of stuck-at and cross-connect errors with the redefinable contact used as input and output contact respectively.

2. An integrated circuit according to claim 1, comprising a controllable coupling enabled or disabled by said circuit configuration, the test pattern converter having first inputs coupled to the input contacts, first outputs coupled to the output contacts, a second input coupled to the redefinable contact and a second output coupled to the redefinable contact via the controllable coupling.

3. An integrated circuit according to claim 2, the test pattern converter comprising a collection of exclusive or and/or exclusive nor circuits, coupled between the first and second inputs and the first and second outputs, so that the signal at each output depends on an exclusive or of signals from a respective group of the first and second inputs, where each group contains at least two of the input contacts, no two groups being identical or identical but for the second input, and each the first and second inputs belonging to at least one of the groups.

4. An integrated circuit according to claim 3, wherein the group associated with the second output does not contain the second input.

5. An integrated circuit according to claim 3, comprising a first and second subconverter and a multiplexer, the first and second sub converter having the first and second input/output relation respectively, outputs of the first and second sub converter being coupled to the output contacts and the input of the controllable coupling, inputs of the first sub-converter being coupled to the input contacts and the redefinable contact, inputs of the second subconverter being coupled to the input contacts.

6. An electronic circuit comprising
one or more first integrated circuits having first and second contacts and a test interface for writing and reading test data to the first contacts and second contacts respectively;
a second integrated circuit having input contacts, output contacts and a redefinable contact having an input or output function selected dependent on a circuit configuration;
connections between first contacts and the input contacts, between the second contacts and the output contacts and between the redefinable contact and the first or the second contacts, the second integrated circuit being switchable between a normal operating mode and a test mode, the second integrated circuit comprising a functional circuit and a test pattern converter, both coupled between the input contacts, the output contacts and the redefinable contact, the functional circuit and the test pattern converter, in the normal operating mode and the test mode respectively, driving the outputs contacts and, dependent on the circuit configuration, the redefinable contact, the test pattern converter being arranged to provide a first and second relation between signals at the input contacts and the output contacts, with the redefinable contact used as an input or output contact respectively, dependent on the circuit configuration, the relations having been selected so as to permit testing of stuck-at and cross-connect errors with the redefinable contact used as input and output contact respectively.

7. An electronic circuit according to claim 6, comprising a controllable coupling enabled or disabled by said circuit configuration the test pattern converter having first inputs coupled to the input contacts, first outputs coupled to the output contacts, a second input coupled to the redefinable contact and a second output coupled to the redefinable contact via the controllable coupling.

8. An electronic circuit according to claim 7, the test pattern converter comprising a collection of exclusive or and/or exclusive nor circuits, coupled between the first and second inputs and the first and second outputs, so that the signal at each output depends on an exclusive or of signals from a respective group of the first and second inputs, where each group contains at least two of the input contacts, no two groups being identical or identical but for the second contact, and each the first and second inputs belonging to at least one of the groups.

9. An electronic circuit according to claim 8, wherein
the group associated with the second output does not contain the second input.

10. An electronic circuit according to claim 7, comprising a first and second subconverter and a multiplexer, the first and second sub converter having the first and second input/output relation respectively, outputs of the first and second sub converter being coupled to the output contacts and the input of the controllable coupling, inputs of the first sub-converter being coupled to the input contacts and the redefinable contact, inputs of the second subconverter being coupled to the input contacts.

11. A method of testing an electronic circuit that contains an integrated circuit that is switchable between a normal operating mode and a test mode, the integrated circuit having input contacts, output contacts and a redefinable contact having an input or output function selected dependent on a circuit configuration, the integrated circuit being arranged to provide in the test mode a first and second relation between signals at the input contacts and the output contacts, with the redefinable contact used as an input or output contact respectively, dependent on the circuit configuration, the relations having been selected so as to permit testing of stuck-at and cross-connect errors with the redefinable contact used as input and output contact respectively,
the method comprising
switching the integrated circuit between a first and second input/output relation, between signals at the input contacts and the output contacts, with the redefinable contact used as an input or output contact respectively, dependent on the circuit configuration;
applying a set of successive input signals to the input contacts and, depending on the circuit configuration, to the redefinable contact, so that when the integrated circuit is connected without error normally, each input and output assumes all possible logic values in the set of input signals with their resulting output signals and each difference between signals at any pair of input, any pair of outputs and any pair that consists of both an input and an output assumes all possible logic values in the set of input signals with their resulting output signals;
observing output signals in response to the input signals
detecting whether there are deviations from the output signals that should occur when the integrated circuit is connected without error.

* * * * *